US008279206B2

(12) United States Patent
Ryu

(10) Patent No.: US 8,279,206 B2
(45) Date of Patent: Oct. 2, 2012

(54) DIFFERENTIAL SIGNALING SYSTEM AND FLAT PANEL DISPLAY WITH THE SAME

(75) Inventor: Jee-youl Ryu, Seoul (KR)

(73) Assignee: Samsung Mobile Display Co., Ltd. (KR)

( * ) Notice: Subject to any disclaimer, the term of this patent is extended or adjusted under 35 U.S.C. 154(b) by 1412 days.

(21) Appl. No.: 11/858,423

(22) Filed: Sep. 20, 2007

(65) Prior Publication Data

US 2008/0170052 A1    Jul. 17, 2008

(30) Foreign Application Priority Data

Jan. 11, 2007    (KR) .................. 10-2007-0003360

(51) Int. Cl.
G06F 3/038 (2006.01)
G09G 5/00 (2006.01)
H03K 17/16 (2006.01)
H03K 19/003 (2006.01)
H03K 19/094 (2006.01)

(52) U.S. Cl. ............. 345/204; 326/30; 326/86; 345/214
(58) Field of Classification Search .................... 326/30, 326/82, 86, 87; 345/19, 204, 55, 214
See application file for complete search history.

(56) References Cited

U.S. PATENT DOCUMENTS

| 6,252,419 B1 | 6/2001 | Sung et al. |
| 6,448,813 B2 | 9/2002 | Garlepp et al. |
| 6,448,815 B1 * | 9/2002 | Talbot et al. ............. 326/86 |
| 6,621,308 B2 | 9/2003 | Tinsley et al. |
| 6,847,232 B2 | 1/2005 | Tinsley et al. |
| 7,030,656 B2 | 4/2006 | Lo et al. |
| 7,705,953 B2 * | 4/2010 | Sato ............................ 349/151 |
| 7,898,518 B2 * | 3/2011 | Hong et al. ................. 345/99 |
| 8,018,446 B2 * | 9/2011 | Ryu .............................. 345/204 |
| 2008/0170063 A1 * | 7/2008 | Ryu ............................. 345/214 |
| 2008/0211791 A1 * | 9/2008 | Ryu ............................. 345/204 |
| 2011/0227604 A1 * | 9/2011 | Nakagawa ................... 326/16 |

FOREIGN PATENT DOCUMENTS

| JP | 05-55898 | 3/1993 |
| KR | 2004-41291 | 5/2004 |

OTHER PUBLICATIONS

Notice of Allowance issued in corresponding Korean Patent Application No. 2007-0003360 dated Dec. 21, 2007.

* cited by examiner

Primary Examiner — Shawki S Ismail
Assistant Examiner — Dylan White
(74) Attorney, Agent, or Firm — Knobbe Martens Olson & Bear LLP

(57) ABSTRACT

A differential signaling system and a flat panel display using the system, where a first wiring and a second wiring are connected between a sending end and a receiving end as a differential signal line. A termination resistor is connected between the first wiring and the second wiring in the receiving end side. A programmable compensation circuit is connected to the termination resistor in parallel. The programmable compensation circuits includes: n switches M1, M2, M3, . . . , Mn connected between a first power line and a second power line; first n resistors R11, R12, R13, . . . , R1$n$ connected between a source electrode of each of the switches and the first wiring; and second n resistors R21, R22, R23, . . . , R2$n$ connected between a drain electrode of each of the switches and the second wiring.

18 Claims, 7 Drawing Sheets

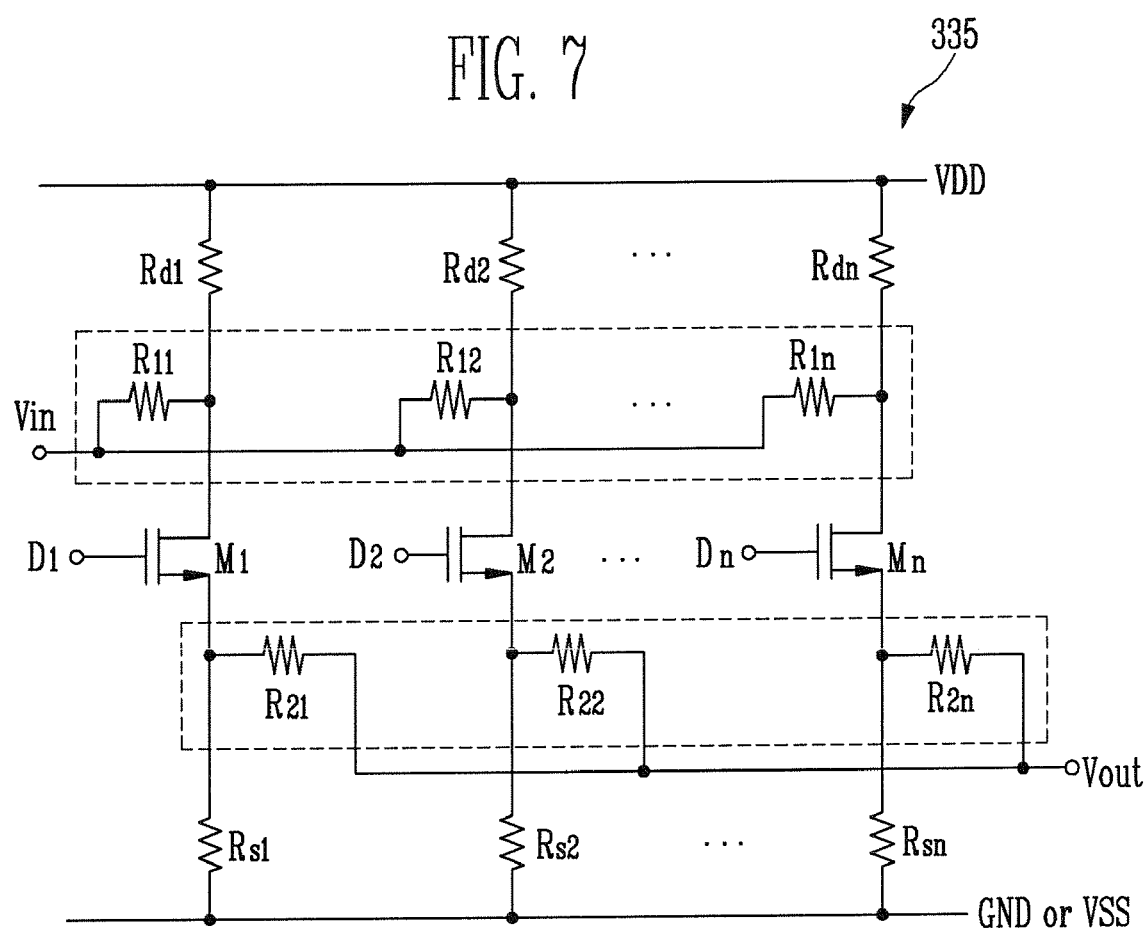

DIFFERENTIAL SIGNALING SYSTEM AND FLAT PANEL DISPLAY WITH THE SAME

CROSS-REFERENCE TO RELATED APPLICATION

This application claims the benefit of Korean Application No. 2007-3360, filed Jan. 11, 2007, in the Korean Intellectual Property Office, the disclosure of which is incorporated herein by reference.

BACKGROUND OF THE INVENTION

1. Field of the Invention

Aspects of the present invention relate to a flat panel display using a signal transmission method of transmitting a differential signal, and more particularly to a flat panel display that includes a differential signaling system for impedance matching that uses the signal transmission method.

2. Description of the Related Art

In general, a cathode ray tube (CRT) is one of widely used display devices. The CRT has been used in a monitor for televisions, measuring instruments, or information terminals. Since the CRT is heavy and large, the CRT cannot keep up with recent requirements for small and light-weight devices.

Accordingly, as a substitute for the CRT, various flat panel displays such as liquid crystal displays (LCD), plasma display panels (PDP), field emission displays (FED), and organic light emitting displays (OLED) have been studied and developed which have advantages in view of small, compact, light-weight, and low electric power consumption requirements. The above described flat panel displays include various components, and wirings to transmit signals between the various components.

Recently, with the development of electronic circuit and manufacturing process technology, signals can be transmitted through the wirings at high speeds. To meet such high speed signal transmission requirements, drive speeds of the components have become high. Accordingly, various methods of transmitting signals between the components through wirings have been suggested. For example, a signal transmission method such as a low voltage differential signal (LVDS) method or a reduced swing differential signaling (RSDS) method of transmitting a differential signal has been used.

A differential signaling system transmits a different mode signal having the same amplitude and a different polarity through a differential transmission line. Accordingly, there is a tendency in the differential signaling system to remove a concentrated magnetic field and to couple an electric field. A high speed signal can be stably transmitted without a signal reflection and a skew (phase delay) electro magnetic interference (EMI) due to the coupled electric field.

A related art flat panel display will be described in detail with reference to the accompanying drawings. FIG. 1 is a block diagram showing a structure of a related art flat panel display. With reference to FIG. 1, the related art flat panel display includes a display panel 40, a gate driver 20, a data driver 30, and a controller 10. Pixels (not shown) are arranged on the display panel 40 in a matrix pattern. The gate driver 20 sequentially applies a scan signal to gate wirings of the display panel 40. The data driver 30 applies an image signal DATA1 to data wirings of the display panel 40. The controller 10 applies the image signal DATA1 from an external graphic controller (not shown) to the data driver 30, and applies a control signal CS1 to the gate driver 20 and the data driver 30 in order to control drive timing. In the related art flat panel display, after all the gate wirings of the display panel 40 are sequentially scanned and the image signal DATA1 is applied to the pixels through the data wirings to display one frame of an image, a vertical synchronous signal VSYNC is applied to display a next frame of the image.

FIG. 2 is a block diagram showing in detail a controller and a data driver shown in FIG. 1. FIG. 3 is a view showing a signal transmission method used between the controller and the data driver. With reference to FIG. 2, the data driver 130 is composed of a plurality of data driving circuits 132. The plurality of data driving circuits 132 receive image signals DATA [+,−] from the controller 110 through first and second wirings W1 and W2, and receive a control signal CS11 from the controller 110 through a third wiring W3.

The data driver 130 includes a plurality of data driving circuits 132 therein. The data driving circuits 132 receive the image signals DATA [+,−] from the controller 110, and output the image signals DATA [+,−] to the data wirings according to the control signal CS11 from the controller 110. Although not shown in drawings in detail, a plurality of data wirings are electrically coupled to the data driving circuits 132, and apply the image signals DATA [+,−] applied to the data driving circuits 132 to the pixels.

The image signals DATA [+,−] from the controller 110 are transmitted to the respective data driving circuits 132 using the aforementioned differential signal transmission method. Namely, as shown in FIG. 3, in order to transmit one data group of the image signals DATA [+,−], a differential transmission line arrangement is provided. Namely, first and second wirings W1 and W2 are provided between the controller 110, being a sending end Tx, and the data driving circuit 132, being a receiving end Rx.

On the other hand, a termination resistor Rt is installed between differential transmission lines of the receiving end Rx (data driving circuit 132) side. The termination resistor Rt electrically connects the first wiring W1 and the second wiring W2 to each other, which are connected to each data driving circuit 132. Accordingly, an image signal DATA [+] that is applied through the first wiring W1 is transferred to the controller 110 by way of the termination resistor Rt and the second wiring W2. The termination resistor Rt prevents an excessive current from flowing into the data driving circuit 132. A voltage across the termination resistor Rt is the image signals DATA [+,−], which is applied to the data driving circuit 132.

A plurality of electric devices and wirings are provided in the flat panel display, and are electrically coupled to each other. Since the electric devices and wirings have an impedance component, the impedance component generates an attenuation of a signal during the signal's transmission between the electric devices. Accordingly, the controller 110 and the data driving circuits 132 have an impedance component. Further, the first and second wirings W1 and W2 to connect the controller 110 and the data driving circuits 132 have an impedance component Z0.

If the impedance value Z0 of the first and second wirings W1 and W2 is different from that of the data driving circuits 132, namely, when an impedance mismatching occurs, the image signals DATA[+,−] are not exactly supplied to the data driving circuits 132. That is, a part of the image signals DATA [+,−] is reflected and discharged.

In detail, a reflection coefficient Γ caused by the impedance mismatch is expressed by a following equation 1.

$$\Gamma = \frac{Z_{diff} - R_t}{Z_{diff} + R_t} \quad (1)$$

where, a differential impedance $Z_{diff}$ is a value that is less than a sum (2Z0) of impedance values of the first and second wirings (W1, W2), and has a different value depending on variations in a manufacturing process and construction of the flat panel display.

According to equation (1), when the differential impedance $Z_{diff}$ is identical with a value of the termination resistor $R_t$, a reflection loss of a signal does not occur. However, the differential impedance $Z_{diff}$ varies in practice. Accordingly, in the related art, impedance matching is not normally achieved in the differential transmission method.

When a reflection wave occurs due to impedance mismatching, an interference with the image signals DATA [+,−] applied through the first wiring W1 occurs to cause unstable waves, signal distortions, and signal attenuations. The electro magnetic interference (EMI) also deteriorates image quality of the flat panel display.

SUMMARY OF THE INVENTION

Accordingly, it is an aspect of the present invention to provide a differential signaling system and a flat panel display, which more accurately perform impedance matching without or reduce electro magnetic interference in order to stably transmit a high speed signal by compensating variation of a differential impedance by a programmable compensation circuit in a flat panel display that uses a signal transmission method of transmitting a differential signal, wherein the programmable compensation circuit is installed inside a data driving circuit, being a receiving end, and performs impedance matching for a differential signal transmission method.

The foregoing and/or other aspects of the present invention are achieved by providing a differential signaling system having a sending end and a receiving end including a first wiring and a second wiring connected between the sending end and the receiving end as a differential signal line; a termination resistor connected between the first wiring and the second wiring at the receiving end; and a programmable compensation circuit connected to the termination resistor in parallel, wherein the programmable compensation circuits includes: n switches M1, M2, M3, . . . , Mn connected between a first power line and a second power line; first n resistors R11, R12, R13, . . . , R1n connected between a source electrode of each of the switches and the first wiring; and second n resistors R21, R22, R23, . . . , R2n connected between a drain electrode of each of the switches and the second wiring.

According to another aspect of the present invention, a flat panel display includes a display panel in which a plurality of data wirings and gate wirings are arranged to intersect each other; a controller to receive an image signal from an exterior and generate a control signal, and to output the image signal and the control signal through the first and second wirings as a differential signal line; a gate driver to receive the control signal from the controller and apply a scan signal to the gate wirings; and a plurality of data driving circuits including a programmable compensation circuit connected to a terminal resistor in parallel installed between the first and second wirings, to automatically control an impedance value of a data driving circuit corresponding to a differential impedance value of the differential signal line, each of the data driving circuits including a data driver to receive the image signal and/or the control signal from the controller through the first and second wirings and apply the image signal to the data wirings, wherein the programmable compensation circuits includes: n switches M1, M2, M3, . . . , Mn connected between a first power line and a second power line; first n resistors R11, R12, R13, . . . , R1n connected between a source electrode of each of the switches and the first wiring; and second n resistors R21, R22, R23, . . . , R2n connected between a drain electrode of each of the switches and the second wiring.

According to an aspect of the present invention, a data driving circuit to receive and output a differential signal in a flat panel display device, includes first and second wirings having impedance values; and an impedance compensation circuit to selectively match the impedance values of the first and second wirings, the circuit including a plurality of individually selectable switches connected in parallel between the first and second wirings, wherein the selection of one or more of the switches varies an impedance value of the circuit to match the impedance values of the first and second wirings.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIG. 7 is a detailed circuitry diagram of an programmable compensation circuit according to an aspect of the present invention.

DETAILED DESCRIPTION OF THE EMBODIMENTS

Figure 1:
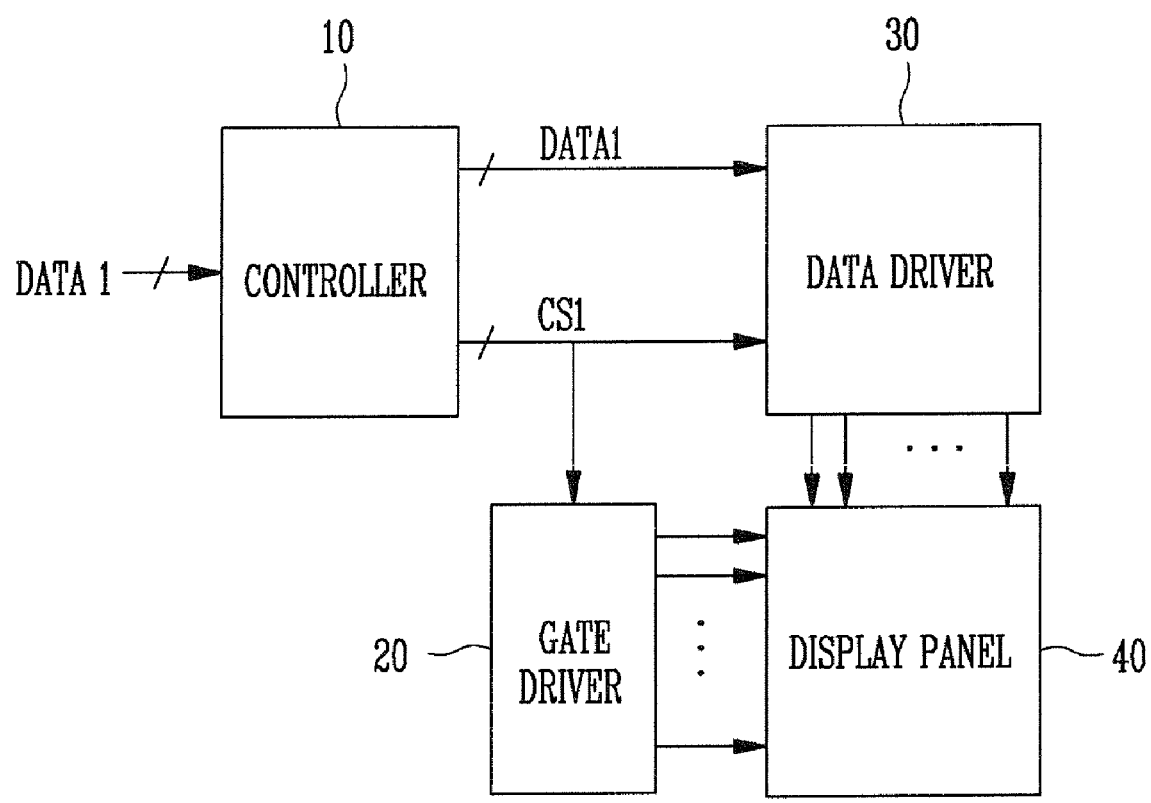
FIG. 1 is a block diagram showing a structure of a related art flat panel display.
Figure 2:
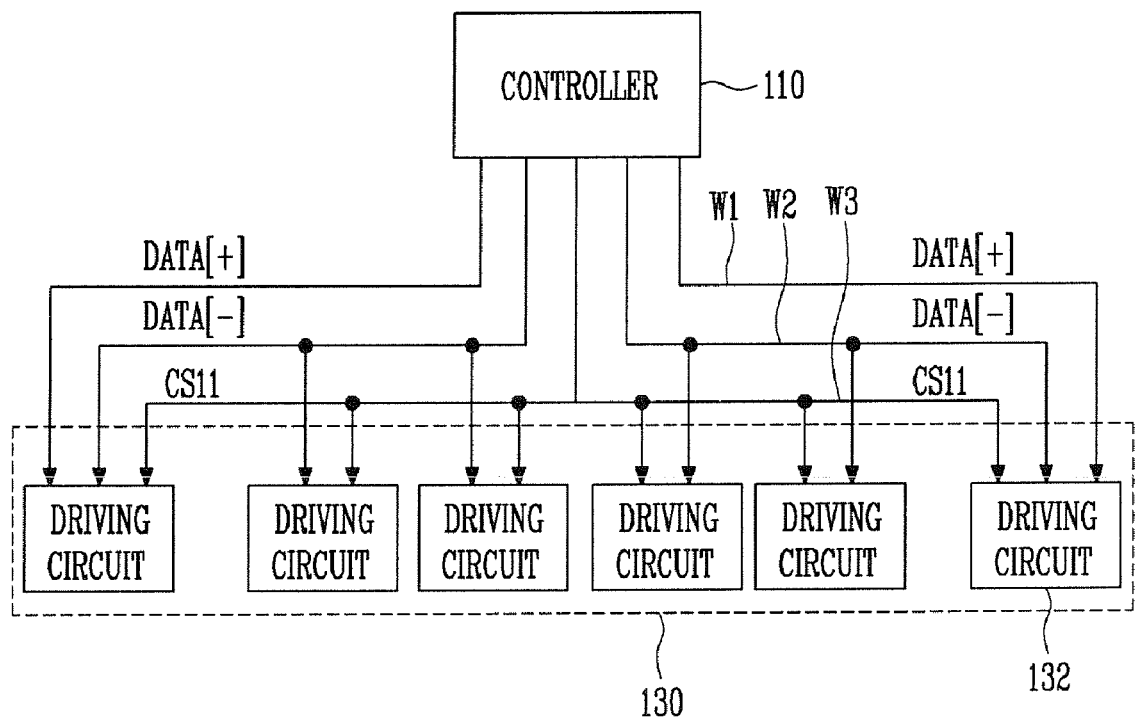
FIG. 2 is a block diagram showing in detail a controller and a data driver shown in FIG. 1.
Figure 3:
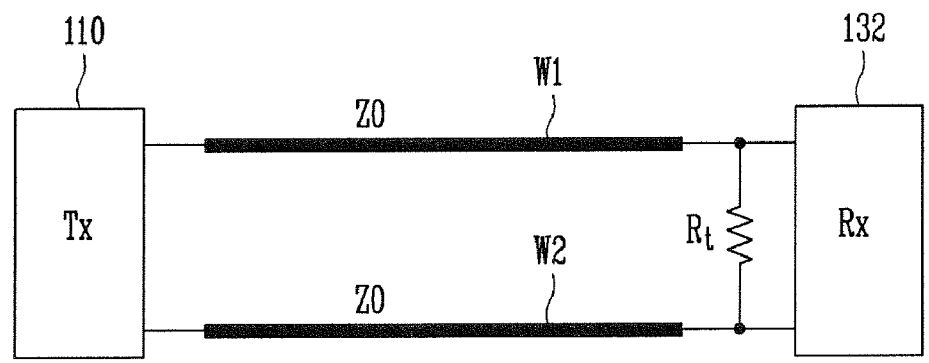
FIG. 3 is a view showing a signal transmission method between the controller and the data driver of FIG. 2.

Reference will now be made in detail to the aspects of the present invention, examples of which are illustrated in the accompanying drawings, wherein like reference numerals refer to the like elements throughout. The aspects are described below in order to explain the present invention by referring to the figures.

Figure 4:
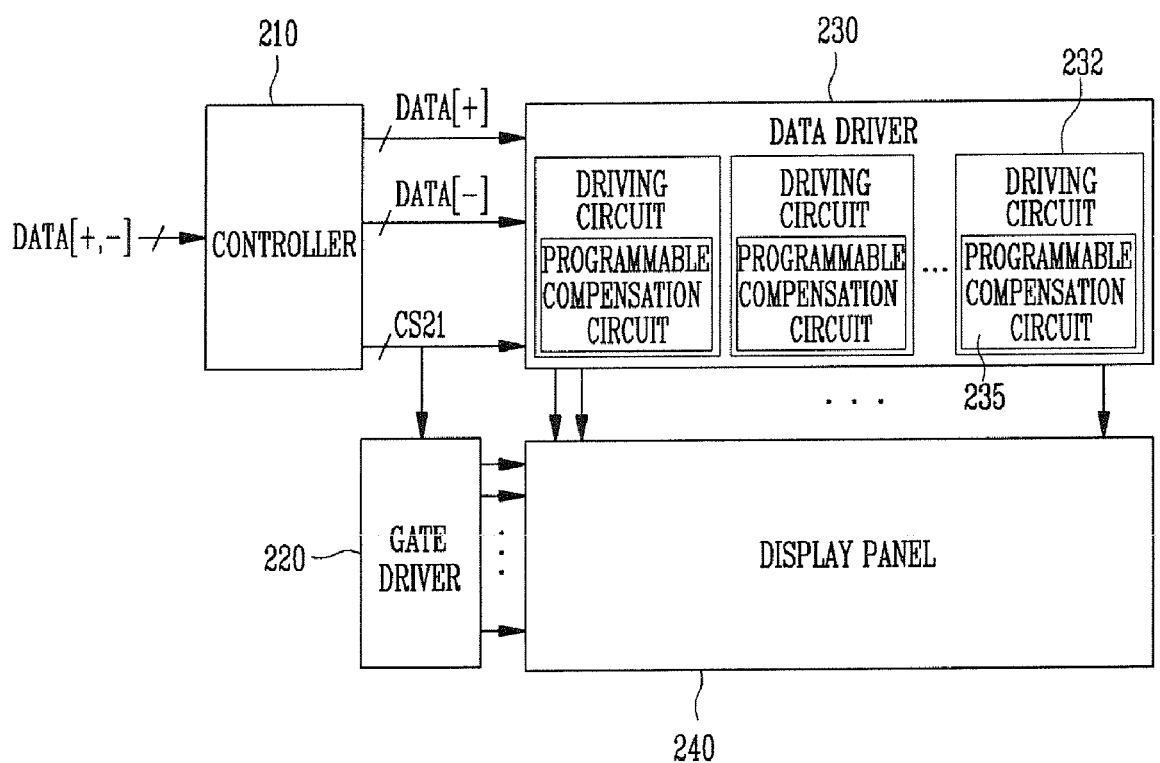
FIG. 4 is a block diagram showing a structure of a flat panel display according to an aspect of the present invention.

In the aspects, when one element is connected to another element, the one element may be not only be directly connected to another element but also be indirectly connected to another element via another element. FIG. 4 is a block diagram showing a structure of a flat panel display according to an aspect of the present invention. The flat panel display includes a display panel 240, a gate driver 220, a data driver 230, and a controller 210. Gate lines and data lines are arranged to intersect each other on the display panel 240. The gate driver 220 sequentially applies a scan signal to gate wirings of the display panel 240. The data driver 230 applies image signals DATA [+,−] to data wirings of the display panel 240. The controller 210 applies the image signals DATA [+,−] from an external graphic controller (not shown) to the data driver 230, and applies a control signal CS21 to the gate driver 220 and the data driver 230 in order to control a drive timing.

Further, the flat panel display uses a signal transmission method to transmit a differential signal. A programmable compensation circuit 235 is installed inside a data driving circuit 232, being a receiving end, and compensates a variation of a differential impedance in order to more accurately perform impedance matching.

In the display panel 240, a plurality of the gate wirings are arranged to be spaced apart from each other in a transverse direction, for example, and a plurality of the data wirings are arranged to be spaced apart from each other in a longitudinal direction, for example. The gate wirings and the data wirings intersect each other to divide (or define) a plurality of regions. The regions are referred to as 'pixels'. The pixels are electrically coupled to the gate wirings and the data wirings, and are arranged on the display panel 240 in a matrix pattern, for example.

The controller 210 represents a timing controller. The controller 210 receives the image signals DATA [+,−] and generates various control signals CS21 to drive the flat panel display. The controller 210 applies the image signals DATA [+,−] to the data driver 230, and applies the control signal CS21 to the gate driver 220 and the data driver 230 to control the drive timing. As shown, the controller 210 applies the control signal CS21 to control a drive timing of the gate driver 220 and the data driver 230. The control signal CS21 may be a vertical synchronous signal VSYNC, a horizontal synchronous signal HSYNC, a clock signal, a gate start signal, and a data output enable signal to the gate driver 220, the data driver 230, and/or other signals.

That is, the controller 210 applies the horizontal synchronous signal HSYNC and the gate start signal to the gate driver 220 to sequentially apply the scan signal to the gate wirings of the display panel 240. Further, the controller 210 applies the horizontal synchronous signal HSYNC, the data output enable signal, and the image signals DATA [+,−] to the data driver 230, so that the image signals DATA [+,−] are applied to the pixels of the gate wiring to which the scan signal is applied. This causes the drive timing of the gate driver 220 and the data driver 230 to be controlled.

The data driver 230 is electrically coupled to the display panel 240 through the data wirings. The data driver 230 includes a plurality of data driving circuits 232. Each of the data driving circuits 232 receives the image signals DATA [+,−] and the control signal CS21 from the controller 210, and outputs the image signals DATA [+,−] to the data wirings.

A programmable compensation circuit 235 is installed at input terminals of each data driving circuit 232. As shown, the data driving circuit 232 receives the image signals DATA [+,−] from the controller 210. A differential impedance from the controller 210 to the data driving circuit 232 and an impedance of the data driving circuit 232 are matched so that the image signals DATA [+,−] from the controller 210 are supplied easily.

The following are details of a structure and operation of the programmable compensation circuit 235 with reference to the accompanying drawings. Moreover, the gate driver 220 receives the control signal CS21 from the controller 210, and sequentially applies the scan signal to the gate wirings to drive the pixels arranged in the matrix of the gate wirings. The data driver 230 applies the image signals DATA [+,−] to the pixels to which the scan signal is applied through the data wirings. Through the aforementioned operation, after all the gate wirings of the display panel 240 are sequentially scanned and the image signals DATA[+,−] are applied to the pixels through the data wirings to display one frame of an image, the vertical synchronous signal VSYNC is applied to display a next frame of the frame.

Figure 5:
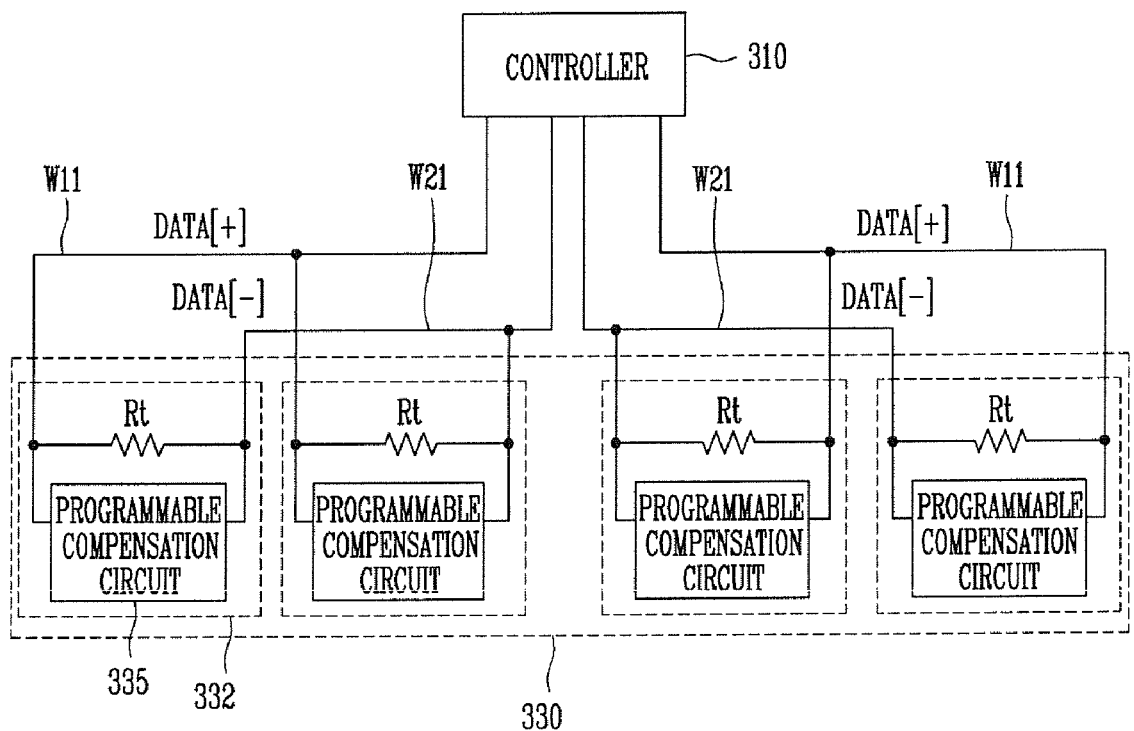
FIG. 5 is a detailed view showing the controller and the data driver shown in FIG. 4.
Figure 6:
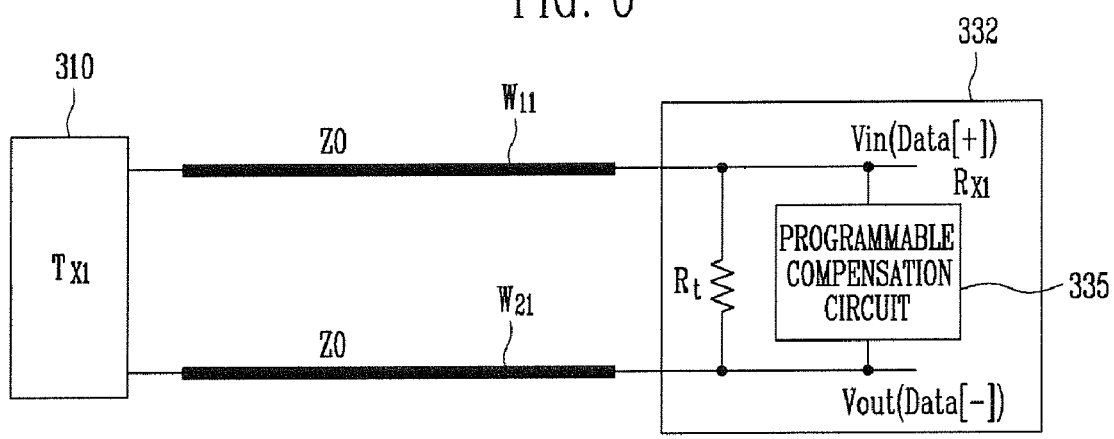
FIG. 6 is a block diagram showing a differential signaling system according to an aspect of the present invention.

FIG. 5 is a detailed view showing the controller and the data driver shown in FIG. 4. FIG. 6 is a block diagram showing a differential signaling system according to an aspect of the present invention. Namely, FIG. 6 is a view illustrating a signal transmission method between the controller and the data driver shown in FIG. 5. FIG. 7 is a detailed circuitry diagram of the programmable compensation circuit of FIG. 4.

With reference to FIG. 5, the flat panel display includes a controller 310 and a data driver 330. The controller 310 receives the image signals DATA[+,−] and applies the image signals DATA [+,−] to the first and second wirings W1 and W2, respectively. The data driver 330 includes a plurality of data driving circuits 332. The plurality of data driving circuits 332 has its impedance matched with an exterior impedance, and receive the image signals DATA [+,−] from the controller 310 through the first and second wirings W11 and W21.

The controller 310 and the data driving circuits 332 transmit the image signals DATA [+,−] and the control signal CS21, for example, by a low voltage differential signaling (LVDS) transmission method, which transmit signals at high speeds. That is, the controller 310 is electrically connected to the data driver 330 through the first and second wirings W11 and W21.

The data driver 330 includes a plurality of the data driving circuits 332. Each of the data driving circuits 332 receives the image signals DATA [+,−] from the controller 310 through the first and second wirings W11 and W21. However, for convenience of description, wirings to supply the control signal CS21 are not shown in FIG. 5. Rather, a pair of first and second wirings W11 and W21 is connected to each data driving circuit 332. In practice, a plurality of pairs of the first and second wirings W11 and W21 can be connected to each data driving circuit 332.

The first and second wirings W11 and W21 are connected to the data driving circuit 332, and the first and second wirings W11 and W21 are electrically connected through a termination resistor $R_t$ to form a closed circuit. Accordingly, the image signals DATA [+,−] from the controller 310 are applied to the terminal resistor $R_t$ with a certain voltage. The terminal resistor $R_t$ prevents or reduces an excessive current from flowing into the data driving circuit 332, and applies a constant voltage corresponding to the image signals DATA [+,−] to the data driving circuit 332.

Namely, as shown in FIG. 6, in order to transmit one data group of the image data signals DATA [+,−], a differential transmission line arrangement, namely, first and second wirings W11 and W21, is provided between the controller 310 (being a sending end Tx1) and the data driving circuit 332 (being a receiving end Rx1). A termination resistor $R_t$ is provided between the differential transmission lines (corresponding to first and second wiring lines W11 and W21) of the data driving circuit 332 (being the receiving end Rx1). The termination resistor $R_t$ electrically connects the first and second wirings W11 and W21 connected to each data driving circuit 332 to form a closed circuit.

As described earlier, when only the termination resistor $R_t$ is connected between the differential transmission lines, since the differential impedance $\overline{Z_{diff}}$ can vary due to external factors, impedance matching is normally not achieved when using the differential transmission method. In view of this and/or other problems, in aspects of the present invention, the programmable compensating circuit 335 is connected to the termination resistor $R_t$ in parallel. Through the programmable compensating circuit 335, an impedance value of a receiving end Rx1, namely, the data driving circuit 332 corresponding to the differential impedance value, is automatically controlled, and more accurate matching of impedance can be realized.

As shown, a reflection coefficient Γ in the system including the programmable compensation circuit 335, namely, a differential signaling system according to an aspect of the present invention shown in FIG. 6, is expressed by a following equation 2.

$$\Gamma = \frac{\overline{Z_{diff}} - Z_{TN}}{\overline{Z_{diff}} + Z_{TN}} \qquad (2)$$

where, $\overline{Z_{diff}}$ is a changeable differential impedance (or a predetermined impedance), $Z_{TN}$ is a parallel composite impedance of the programmable compensating circuit 335 and the termination resistor $R_t$ connected in parallel. Specifically, the parallel composite impedance $Z_{TN}$ is expressed by a following equation 3.

$$Z_{TN} = R_t \,//\, Z_{PCC} = R_t \,//\, \frac{N}{M}R_b = \frac{R_t}{1 + \frac{M}{N}\left(\frac{R_t}{R_b}\right)} \qquad (3)$$

where, $R_t$ represents a terminal resistance, and $Z_{PCC}$ represents a total composite resistance of the programmable compensation circuit 335. Further, $R_b$ represents a resistance value of one or more resistors included in the programmable compensation circuit 335, N represents a bit number of a digital control signal inputted to the programmable compensation circuit 335, and M represents a logic high bit number of the input digital control signal.

The differential impedance $\overline{Z_{diff}}$ is a value that is less than a sum (2Z0) of impedance values of the first and second wirings (W11, W21). The differential impedance $\overline{Z_{diff}}$ can change depending on variations in a manufacturing process and arrangement of the flat panel display. As illustrate in the equation 3, since the value of the parallel composite impedance $Z_{TN}$ varies by an operation of the programmable compensation circuit 335, a variation of the differential impedance $\overline{Z_{diff}}$ can be compensated. That is, the programmable compensation circuit 335 operates so that a size (or value) of the $Z_{TN}$ is identical (or very close) with the $\overline{Z_{diff}}$, so that the reflection coefficient becomes (or very close to) zero, to thereby remove or reduce a reflection loss of a signal.

Since the programmable compensation circuit 335 is connected to the termination resistor $R_t$ in parallel, an exact or improved impedance matching is realized with a differential (or varying) impedance value by the first and second wirings W11 and W21 coupled with the data driving circuit 332. Accordingly, the image signals DATA [+,−] applied through the first and second wirings W11 and W21 are reflected, the image signals DATA [+,−] a part of which is lost or distorted by a reflecting wave can prevent or reduce an electro magnetic interference (EMI) applied to the data driving circuits 332. Accordingly, since the image signals DATA [+,−] having a stable wave from the controller 310 are applied easily to the data driving circuit 332, deterioration in image quality of the flat panel display is prevented or reduced.

A structure of the programmable compensation circuit 335 will be explained referring to FIG. 7. With reference to FIG. 7, the programmable compensation circuit 335 includes n switches M1, M2, M3, . . . , Mn; first n resistors R11, R12, R13, . . . , R1n; and second n resistors R21, R22, R23, . . . , R2n. The n switches M1, M2, M3, . . . , Mn are connected between a first power line VDD and a second power line GND or VSS. The first n resistors R11, R12, R13, . . . , R1n are connected between a source electrode of each switch Mn and a first wiring W11 (shown as Vin) of a differential signal line, respectively. The second n resistors R21, R22, R23, . . . , R2n are connected between a drain electrode of each switch Mn and a second wiring W21 (shown as Vout) of the differential signal line, respectively.

Moreover, as shown in FIG. 7, third n resistors Rd1, Rd2, . . . , Rdn are connected between the first power line VDD and a source electrode of each switch Mn, respectively. Fourth n resistors Rs1, Rs2, . . . , Rsn are connected between the second power line (GND or VSS) and a drain electrode of each switch Mn, respectively. As shown, the number n of switches Mn indicates a digital bit number (N) of a control signal (a bit number of a digital control signal) to control the programmable compensation circuit 335. When the programmable compensation circuit 335 operates with 8 bits, the n becomes 8. Hereinafter, it is assumed that the programmable compensation circuit 335 operates by an 8 bit control signal. However, any number may be used in other aspects.

As shown, the switch Mn can be used as a transistor. It is preferred, though not required, that the transistor has a layout with a minimum distributed gate resistance so as to minimize an influence by thermal noise. Further, it is preferred, though not required, that the transistor is designed to be operated in a deep triode region not to have any DC offset between input and output voltages. Moreover, resistances of the first n resistors R11, R12, R13, . . . , R1n and the second n resistors R21, R22, R23, . . . , R2n have the same value, which is $(N/M)R_b$. As described above, the $R_b$ represents a resistance value of one or more resistors included in the programmable compensation circuit 335. However, this is only one aspect, and the present invention is not limited thereto.

Furthermore, N is the digital control signal bit number inputted to the programmable compensation circuit 335. M is the logic high bit number of the input digital control signal. An aspect of the present invention will be described where N is 8 and M is 2 by way of example. Namely, when the programmable compensation circuit 335 operates with 8 bits, a first of eight resistors and a second of eight resistors are provided, and resistance values thereof are $(8/2)R_b$, that is, $4R_b$.

Furthermore, the third n resistors Rd1, Rd2, . . . , Rdn connected between the first power line VDD and a source electrode of each switch Mn and the fourth n resistors Rs1, Rs2, . . . , Rsn connected between the second power line GND or VSS and a drain electrode of each switch Mn have a large resistance of several KΩ.

Moreover, a power source (or power) is applied to the first power line VDD and the second power line GND or VSS in order to normally operate the n switches connected between the first power line VDD and the second power line GND or VSS, namely, to prevent or reduce the n switches from being floated. As shown in FIGS. 8A-8D, hereinafter, 0 V is applied to the first power line VDD and the second power line GND or VSS in an alternating current equivalent circuit.

Figure 8A:
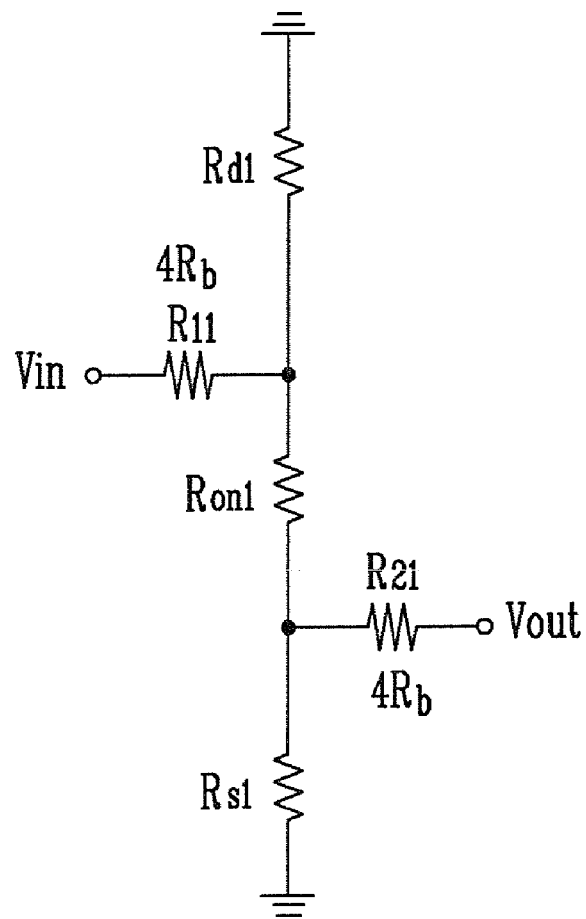
FIGS. 8A through 8D are views to illustrate an operation of the programmable compensation circuit shown in FIG. 7.

FIGS. 8A through 8D are views to illustrate an operation of the programmable compensation circuit shown in FIG. 7. First, FIG. 8A shows an alternating current equivalent circuit when 8 bit control signal (D8, D7, . . . , D1) inputted to the programmable compensation circuit are (0,0, . . . ,1), namely, if only a switch M1 among the switches Mn is turned on but the remaining switches are turned off. As shown, the first resistor R11 and the second resistor R21 have a resistance of $4R_b$. It is assumed that the shown resistor Ron1 is the turned-on resistor of the switch M1, and has a very small resistance value.

Namely, when it is assumed that the third resistor Rd1, the fourth resistor Rs1, and the resistor Ron1 satisfy a condition of a following equation 4, an electric current flowing through the third resistor Rd1 and the fourth resistor Rs1 can be ignored due to a large resistance value thereof. Further, a voltage drop in the resistor Ron1 having the very small resistance value can be disregarded.

$$Rd1=Rs1, \ldots, Rd8=Rs8 \gg 4R_b,$$

$$Ron1, \ldots, Ron8 \ll 4R_b \quad (4)$$

Figure 8B:
Figure 8C:

As a result, an alternating current equivalent circuit of FIG. 8A can be expressed by an equivalent circuit shown in FIG. 8B, which in turn, can be expressed by an equivalent circuit shown in FIG. 8C. As shown in FIG. 8C, the alternating current equivalent circuit of FIG. 8A has a resistance value of $8R_b$ by a method of calculating an equivalent resistance value of a serial resistor connection. Namely, when a control signal of (0,0, . . . , 1) is inputted to the programmable compensation circuit 335, a resistance value of the programmable compensation circuit 335 becomes $8R_b$.

Figure 8D:
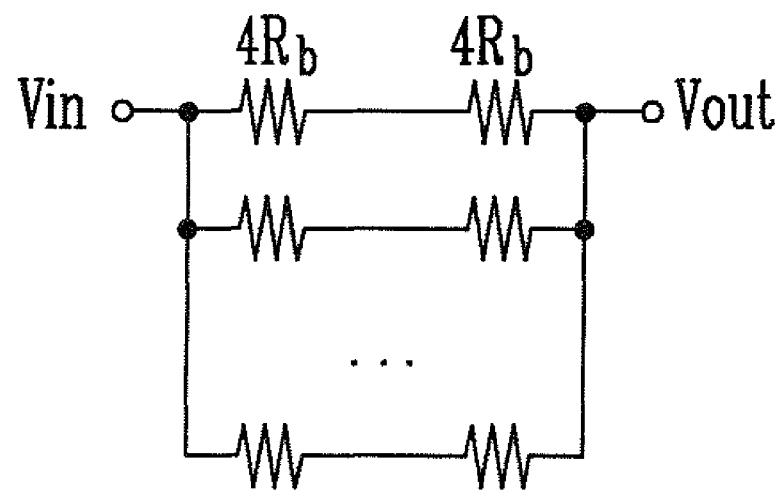

In the same manner, when the control signal (D8, D7, . . . , D1) applied to the switches Mn are (1,1, . . . , 1), namely, when eight switches M1, M2, . . . , M8 are turned-on, the alternating current equivalent circuit of FIG. 8A is expressed by an alternating current equivalent circuit as shown in FIG. 8D. The alternating current equivalent circuit of FIG. 8A has a resistance value of $R_b$ by a method of calculating an equivalent resistance value of serial and parallel resistor connections. That is, when the control signal of (1,1, . . . , 1) is inputted to the programmable compensation circuit, a resistance value of the programmable compensation circuit 335 becomes $R_b$.

As mentioned earlier, in the programmable compensation circuit 335, since a resistance value is adjusted according to an input control signal of n bits, as illustrated in equation 3, the parallel composite impedance $Z_{TN}$ can be controlled to be identical (or very close) with a value of $\overline{Z_{diff}}$. Once identical (or nearly identical), a reflection coefficient Γ becomes zero (or nearly zero) to allow a reflection loss of a signal to be removed (or reduced).

As explained above, the programmable compensation circuit 335 is connected to a termination resistor $R_t$ included in each data driving circuit 332. Accordingly, an exact or improved impedance matching is realized with a differential (or varying) impedance value by the first and second wirings W11 and W21, which are coupled to the data driving circuit 332. Accordingly, the image signals DATA [+,−] applied through the first and second wirings W11 and W21 are reflected, and the image signals DATA [+,−], a part of which is lost or distorted by a reflecting wave, can prevent or reduce an electro magnetic interference (EMI) applied to the data driving circuits 332.

Accordingly, since the image signals DATA [+,−] having a stable wave from the controller 310 are applied easily to the data driving circuit 332, deterioration in image quality of the flat panel display is prevented or reduced.

In various aspects, signal or signals may refer to both a single signal and a plurality of signals. Also, in various aspects, at least one and and/or refers to one or any combination of the noted elements.

In aspects the present invention, a programmable compensation circuit in a flat panel display using a signal transmission method of transmitting a differential signal may more accurately perform impedance matching without (or reduce) electro magnetic interference in order to stably transmit a high speed signal by compensating variation of a differential impedance. The programmable compensation circuit is installed inside a data driving circuit (being a receiving end), and performs impedance matching for a differential signal transmission method.

Although a few aspects of the present invention have been shown and described, it would be appreciated by those skilled in the art that changes might be made in the aspects without departing from the principles and spirit of the invention, the scope of which is defined in the claims and their equivalents.

What is claimed is:

1. A differential signaling system comprising:
    a first wiring and a second wiring connected between a sending end and a receiving end as a differential signal line;
    a termination resistor connected between the first wiring and the second wiring in the receiving end side; and
    a programmable compensation circuit connected to the termination resistor in parallel,
    the programmable compensation circuits includes:
        n switches M1, M2, M3, . . . , Mn connected between a first power line and a second power line;
        first n resistors R11, R12, R13, . . . , R1n connected between a source electrode of each of the switches and a first wiring;
        second n resistors R21, R22, R23, . . . , R2n connected between a drain electrode of each of the switches and a second wiring;
        third n resistors Rd1 , Rd2, . . . , Rdn connected between the first power line and a source electrode of each of the switches; and
        fourth n resistors Rs1, Rs2, . . . , Rsn connected between the second power line and a drain electrode of each of the switches.

2. The differential signaling system as claimed in claim 1, wherein the third n resistors and the fourth n resistors have a resistance value of several kΩ.

3. The differential signaling system as claimed in claim 1, wherein the number of the switches is a number of digital bits of a control signal to control the programmable compensation circuit.

4. The differential signaling system as claimed in claim 1, wherein each of the switches is a transistor having a distributed gate resistance.

5. The differential signaling system as claimed in claim 1, wherein resistances of the first n resistors R11, R12, R13, . . . , R1n and the second n resistors R21, R22, R23, . . . , R2n are the same value, which is $(N/M)R_b$, wherein the $R_b$ refers to a resistance value of a resistor included in the programmable compensation circuit, the N is a digital control signal bit number inputted to the programmable compensation circuit, and the M is a logic high bit number of the input digital control signal.

6. A flat panel display comprising:
    a display panel in which a plurality of data wirings and gate wirings are arranged to intersect each other;

a controller to receive an image signal and generate a control signal, and to output the image signal and the control signal through first and second wirings as a differential signal line;

a gate driver to receive the control signal from the controller and apply a scan signal to the gate wirings; and a plurality of data driving circuits including a programmable compensation circuit connected to a terminal resistor in parallel installed between the first and second wirings, to automatically control an impedance value of the data driving circuit corresponding to a differential impedance value of the differential signal line, each of the data driving circuits including a data driver to receive the image signal and/or the control signal from the controller through the first and second wirings and apply the image signal to the data wirings, wherein the programmable compensation circuits includes:
n switches M1, M2, M3, ..., Mn connected between a first power line and a second power line,
first n resistors R11, R12, R13, ..., R1n connected between a source electrode of each of the switches and the first wiring,
second n resistors R21, R22, R23, ..., R2n connected between a drain electrode of each of the switches and the second wiring;
third n resistors Rd1, Rd2, ..., Rdn connected between the first power line and a source electrode of each of the switches; and
fourth n resistors Rs1, Rs2, ..., Rsn connected between the second power line and a drain electrode of each of the switches.

7. The flat panel display as claimed in claim 6, wherein third n resistors and the fourth n resistors have a resistance value of several k$\Omega$.

8. The flat panel display as claimed in claim 6, wherein the number of the switches is a number of digital bits of a control signal to control the programmable compensation circuit.

9. The flat panel display as claimed in claim 6, wherein each of the switches is a transistor having a distributed gate resistance.

10. The flat panel display as claimed in claim 6, wherein resistances of the first n resistors R11, R12, R13, ..., R1n and the second n resistors R21, R22, R23, ..., R2n are the same value, which is (N/M)Rb, wherein the $R_b$ represents a resistance value of a resistor included in the programmable compensation circuit, the N is a digital control signal bit number inputted to the programmable compensation circuit, and the M is a logic high bit number of the input digital control signal.

11. A data driving circuit to receive and output a differential signal in a flat panel display device, comprising:
a first power line and a second power line;
first and second wirings having impedance values; and
an impedance compensation circuit configured to selectively match the impedance values of the first and second wirings, the impedance compensation circuit including a plurality of individually selectable switches connected in parallel between the first and second wirings, wherein the impedance compensation circuit further includes a first plurality of resistors respectively corresponding to the switches and connected between the switches and the first and second power lines, wherein the selection of one or more of the switches varies an impedance value of the impedance compensation circuit to match the impedance values of the first and second wirings.

12. The data driving circuit of claim 11, wherein the impedance compensation circuit further includes a second plurality of resistors respectively corresponding to the switches and connected between the switches and the first wiring and between the switches and the second wiring.

13. The data driving circuit of claim 11, wherein the switches have a small resistance of less than a few $\Omega$ and the first plurality of the resistors have a large resistance of several k$\Omega$.

14. The data driving circuit of claim 11, further comprising a termination resistor connected in parallel with the impedance compensation circuit.

15. The data driving circuit of claim 14, wherein the impedance value of the impedance compensation circuit matches the impedance values of the first and second wirings when a reflection coefficient is zero, and the reflection coefficient is expressed as $$\Gamma = \frac{\overline{Z_{diff}} - Z_{TN}}{\overline{Z_{diff}} + Z_{TN}},$$

where, $\overline{Z_{diff}}$ is a predetermined impedance, $Z_{TN}$ is a composite impedance of the impedance compensation circuit and the termination resistor connected in parallel.

16. The data driving circuit of claim 15, wherein the $Z_{TN}$ is expressed by $$Z_{TN} = R_t \mathbin{//} Z_{PCC} = R_t \mathbin{//} \frac{N}{M} R_b = \frac{R_t}{1 + \frac{M}{N}\left(\frac{R_t}{R_b}\right)},$$

where, $R_t$ represents a terminal resistance of the terminal resistor, $Z_{PCC}$ represents a total composite resistance of the impedance compensation circuit, $R_b$ represents a resistance value of one or more resistors included in the impedance compensation circuit, N represents a bit number of a digital control signal inputted to the impedance compensation circuit, and M represents a logic high bit number of the input digital control signal.

17. A data driver comprising:
a plurality of the data driving circuit of claim 11; and
a termination resistor for each data driving circuit, wherein the impedance compensation circuit is connected to the termination resistor.

18. A flat panel display comprising:
the data driving circuit of claim 11;
a display panel connected to the data driving circuit to receive image signals.

* * * * *